US012744502B2

(12) United States Patent
Vigilante et al.

(10) Patent No.: US 12,744,502 B2
(45) Date of Patent: Sep. 22, 2026

(54) TWO-STAGE CIRCUIT WITH POWER SUPPLY REJECTION FILTER

(71) Applicant: QUALCOMM Incorporated, San Diego, CA (US)

(72) Inventors: Marco Vigilante, San Diego, CA (US); Yunliang Zhu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 691 days.

(21) Appl. No.: 18/110,295

(22) Filed: Feb. 15, 2023

(65) Prior Publication Data

US 2024/0275348 A1 Aug. 15, 2024

(51) Int. Cl.
*H03F 3/45* (2006.01)
*H03F 3/72* (2006.01)
*H04B 1/04* (2006.01)

(52) U.S. Cl.
CPC .......... *H03F 3/72* (2013.01); *H03F 3/45179* (2013.01); *H04B 1/04* (2013.01); *H04B 2001/0408* (2013.01)

(58) Field of Classification Search
CPC ...... H03F 3/72; H03F 1/301; H03F 2200/135; H03F 2200/144; H03F 2200/84; H03F 2200/87; H03F 2203/45176; H03F 2203/45192; H03F 2203/45216; H03F 2203/45526; H03F 2203/45644; H03F 2203/45692; H03F 2203/45712; H03F 2203/45716; H03F 2200/153; H03F 2203/45264; H03F 2203/45658; H03F 2203/45718; H03F 3/45192; H03F 3/45183; H03F 2200/451; H03F 2203/456; H03F 2203/92
USPC .................................................. 330/51, 253
See application file for complete search history.

(56) References Cited

U.S. PATENT DOCUMENTS 6,150,884 A 11/2000 Fattaruso
2002/0105382 A1* 8/2002 Kadanka ................ H03F 1/086 330/292
2003/0102851 A1 6/2003 Stanescu et al.
2011/0121800 A1 5/2011 Drebinger
2013/0169361 A1 7/2013 Killat
2014/0035665 A1 2/2014 Nicollini et al.
2014/0091775 A1 4/2014 Tan et al.
(Continued)

FOREIGN PATENT DOCUMENTS

EP 0310135 B1 3/1993
WO 2023011223 A1 2/2023

OTHER PUBLICATIONS

International Search Report and Written Opinion—PCT/US2024/011626 —ISA/EPO—May 16, 2024.

*Primary Examiner* — Jessica Han
*Assistant Examiner* — Khiem D Nguyen
(74) *Attorney, Agent, or Firm* — Loza & Loza LLP

(57) ABSTRACT

A two-stage circuit includes a differential-to-single-ended first stage with a differential pair of transistors. The first stage includes a current mirror including a diode-connected transistor having an RC circuit coupled to a drain of the diode-connected transistor. The current mirror is configured to mirror a power supply noise current conducted by the RC circuit through a first stage output terminal to a gate of an output transistor in a second stage of the two-stage circuit.

17 Claims, 9 Drawing Sheets

(56) References Cited

U.S. PATENT DOCUMENTS

| | | | |
|---|---|---|---|
| 2022/0043471 | A1 | 2/2022 | Guiraud et al. |
| 2024/0143005 | A1 | 5/2024 | Li et al. |

* cited by examiner

TWO-STAGE CIRCUIT WITH POWER SUPPLY REJECTION FILTER

TECHNICAL FIELD

This application relates to two-stage circuits, and more particularly to a two-stage amplifier or a two-stage low-dropout regulator with a power supply rejection filter.

BACKGROUND

A radio frequency transceiver includes a number of components such as digital-to-analog converters, mixers, filters, and amplifiers that all use a power supply voltage for operation. However, noise in the power supply voltage may then couple through these powered components into their output signals, which impacts transceiver performance.

SUMMARY

In accordance with an aspect of the disclosure, a two-stage circuit is provided that includes: a first stage including: a differential pair of transistors; a current mirror coupled to a terminal of a first transistor in the differential pair of transistors, the current mirror including a diode-connected transistor; a resistor-capacitor (RC) circuit coupled between a drain of the diode-connected transistor and ground; and a second stage including an output transistor having a gate coupled to an output terminal of the first stage.

In accordance with another aspect of the disclosure, a power supply rejection method for a two-stage circuit is provided that includes: conducting a first noise current from a power supply rail to an RC compensation circuit at a gate of an output transistor in a second stage of the two-stage circuit responsive to a noise disturbance of a power supply voltage on the power supply rail; conducting a second noise current from a drain of a diode-connected transistor in a current mirror to ground through an RC circuit in a first stage of the two-stage circuit responsive to the noise disturbance; and mirroring the second noise current through the current mirror to the gate of the output transistor to combine the second noise current with the first noise current to conduct a combined noise current through the RC compensation circuit that is less than the first noise current.

In accordance with yet another aspect of the disclosure, a two-stage circuit is provided that includes: a first stage including: a first stage output terminal; a low-impedance node, wherein an impedance of the low-impedance node is lower than an impedance of the first stage output terminal; a differential pair of transistors coupled to the first stage output terminal and the low-impedance node; an RC circuit having a resistor in series with a capacitor, wherein the RC circuit is coupled between ground and the low-impedance node; and a second stage including an output transistor having a gate coupled to the first stage output terminal.

These and other advantageous features may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

Figure 1A:
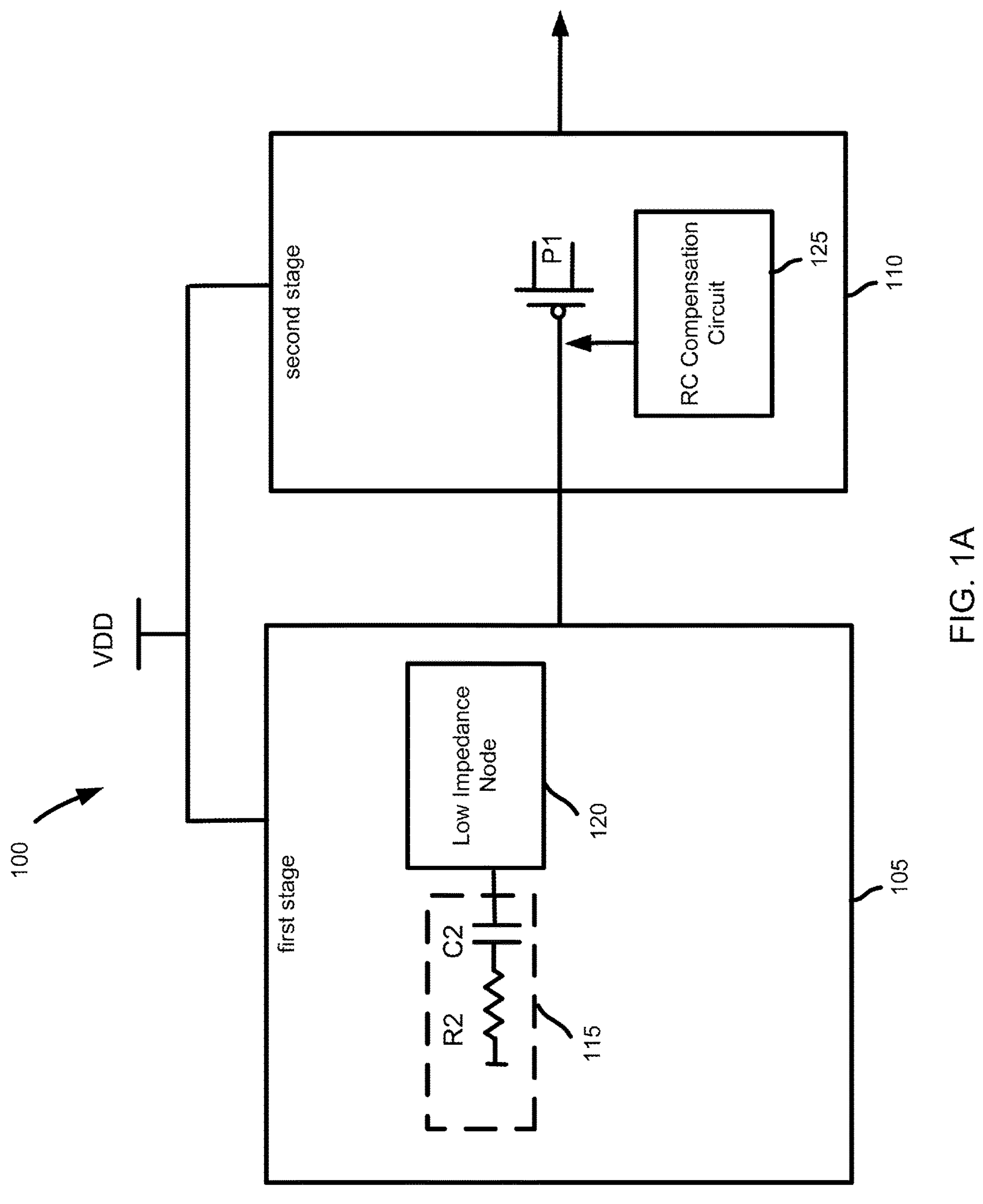
FIG. 1A is a high-level circuit diagram of a two-stage architecture with a power supply rejection filter formed by an RC circuit in accordance with an aspect of the disclosure.

A variety of circuits in a transceiver share a two-stage architecture such as a two-stage operational amplifier or a two-stage low-dropout regulator in which a differential-to-single-ended first stage includes a differential pair of transistors. The first stage includes a first stage output terminal that drives a gate of an output transistor in a second stage of the two-stage circuit. A resistor-capacitor (RC) compensation circuit loads the gate of the output transistor to compensate the two-stage amplifier. With respect to lower-frequency power supply noise in a power supply voltage for the two-stage circuit, the RC compensation circuit is an open circuit (high impedance). As the power supply voltage rises and falls with respect to this lower-frequency noise, so does the gate voltage of the output transistor due to the high impedance of the RC compensation circuit. But as the power supply noise frequency increases above this low-frequency regime into a mid-range frequency regime, the RC compensation circuit has a lower impedance. Noise current can then flow in the RC compensation circuit such that the gate-to-source voltage of the output transistor changes as the mid-range frequency power supply noise rises and falls. This power-supply-noise-induced change in the gate-to-source voltage of the output transistor passes noise to the output voltage of the two-stage circuit.

In the two-stage architecture, the first stage includes a first-stage output terminal that couples to a gate of the output transistor. An RC compensation circuit couples to the gate of the output transistor for compensation. The RC compensation circuit conducts a noise current in a mid-range frequency regime or bandwidth of the noise frequencies in the power supply noise for the power supply voltage powering the output transistor. This conduction is undesirable because the gate-to-source voltage of the output transistor should stay constant despite the power supply voltage rising and falling due to the power supply noise. At lower power supply noise frequencies, the capacitor in the RC compensation circuit acts as an open circuit to the noise current so that the gate-to-source voltage of the output transistor stays relatively constant in the presence of the power supply voltage fluctuations. But in the mid-range power supply noise frequency regime, the capacitor impedance in the RC compensation circuit falls such that the gate-to-source voltage of the output transistor begins to decouple from the variations in the source voltage of the output transistor.

With the RC compensation circuit conducting the noise current the gate voltage of the output transistor may be deemed to approximate a bias voltage. The output transistor thus functions somewhat as a common-gate amplifier. The varying power supply voltage of the output transistor functions as an input voltage that the common-gate amplifier output transistor then amplifies into an output voltage at the drain of the output transistor. The resulting power supply noise in the output voltage is plainly undesirable. For example, the first stage and second stage may form a low-dropout (LDO) regulator that functions to convert the power supply voltage into a regulated output voltage. Such an LDO has numerous uses such as for regulating a power supply voltage for various components including a voltage-controlled oscillator (VCO), a VCO buffer, a phase-locked loop (PLL), a low-noise amplifier, a baseband filter, a power amplifier, a mixer, and the like. The resulting power supply noise in the power supply voltage for these components reduces their fidelity.

In other implementations, the differential-to-single-ended first stage and the second stage may form an operational amplifier. What is common to these various two-stage circuit implementations is that an output terminal of the first stage drives a gate of an output transistor in the second stage that is compensated by an RC compensation circuit. An example two-stage architecture 100 is shown in FIG. 1A formed by a first stage 105 and a second stage 110. Both the second stage 110 and the first stage 105 are powered by a power supply voltage Vdd. The first stage 105 drives a gate of an output transistor (e.g., a p-type metal-oxide semiconductor (PMOS) transistor P1) in the second stage 110. An RC compensation circuit 125 in the second stage 110 functions to compensate the operation of the output transistor. But the output transistor is subjected to power supply noise in the power supply voltage Vdd. With such a two-stage topology, the output transistor can then function to undesirably amplify the power supply noise. To reduce the effect of the power supply noise, an advantageous power supply rejection filter such an RC filter 115 is implemented in the first stage 105. As will be explained further herein, the RC filter 115 couples to a low-impedance node 120 in the first stage 105. This coupling to the low-impedance node 120 causes a noise-induced current to flow in the RC filter 115 that opposes the noise current that would otherwise flow in the output transistor in the second stage 110. As a result, the RC filter 115 functions as a power supply rejection filter that advantageously filters power supply noise that would otherwise affect an output signal from the second stage 110. Some example implementations will now be discussed in more detail.

Figure 1B:
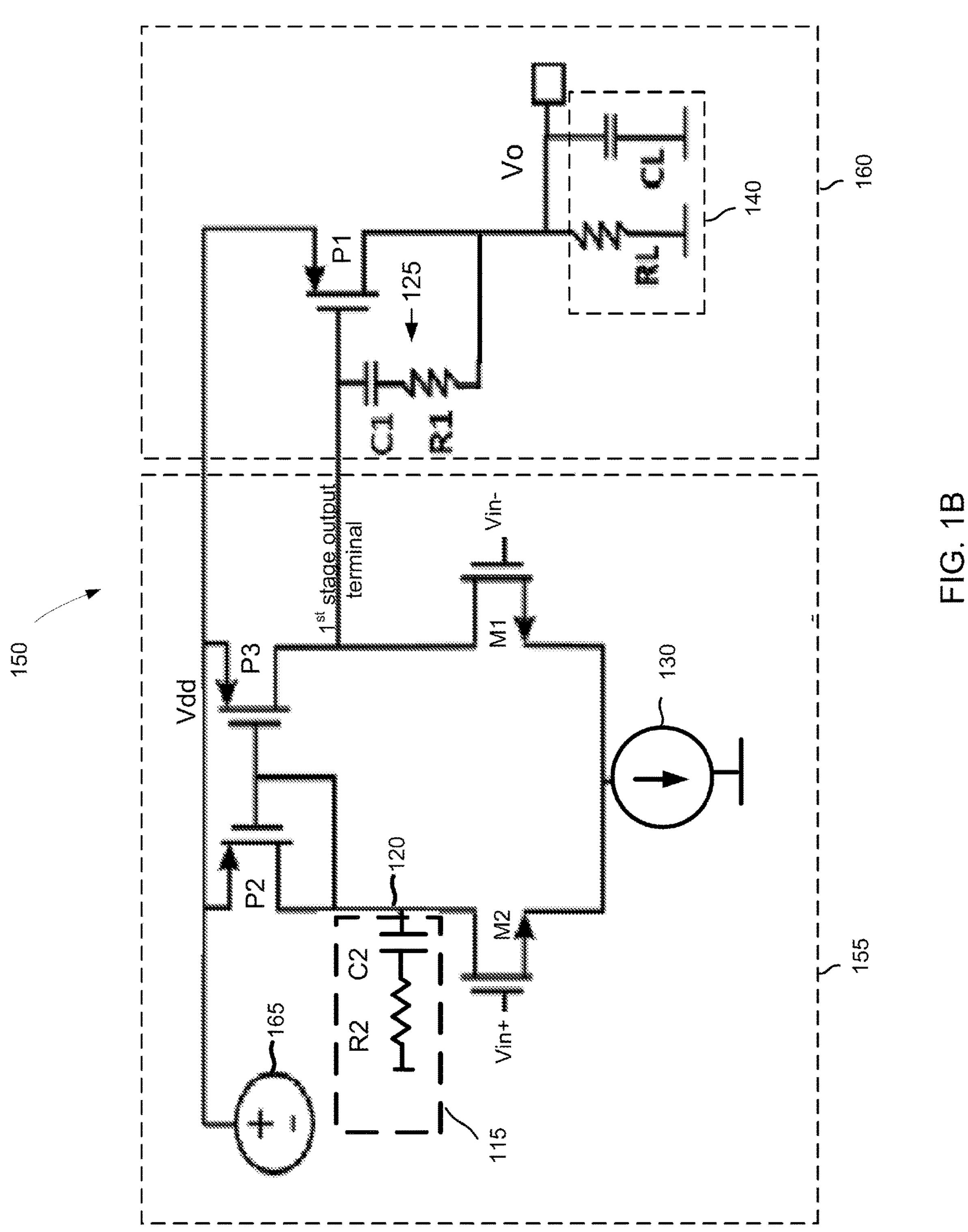
FIG. 1B is a circuit diagram of a two-stage operational amplifier with a power supply rejection filter formed by an RC circuit in accordance with an aspect of the disclosure.

A two-stage operational amplifier 150 is shown in FIG. 1B in which a differential-to-single-ended operational transconductance amplifier (OTA) first stage 155 includes the RC circuit 115 that functions as a power supply rejection filter. An n-type metal-oxide-semiconductor (NMOS) transistor M1 and an NMOS transistor M2 form a differential pair of transistors that share a "tail current" conducted by a current source 130 coupled between the sources of transistors M1 and M2 and ground (alternatively, the sources of transistors M1 and M2 may couple to a suitable reference voltage node instead of ground). Transistor M2 may also be denoted as a first transistor herein whereas transistor M1 may be denoted herein as a second transistor. A positive component Vin+ of a differential input voltage drives a gate of transistor M2 whereas a negative component Vin-of the differential input voltage drives a gate of transistor M1. As the negative component Vin-rises, and the positive component Vin+ falls, the tail current from the current source 130 will tend to conduct entirely through transistor M1 whereas virtually no current will conduct through transistor M2. A drain voltage of transistor M2 will thus rise whereas a drain voltage of transistor M1 will fall. The drain of transistor M1 couples to an output terminal of the first stage 155.

The action of the differential pair of transistors M1 and M2 is differential but the output terminal of the first stage 155 is a single-ended output terminal. As just noted, as transistor M1 conducts, the output terminal voltage will fall. But without more, transistor M2 cannot charge the output terminal voltage as transistor M2 begins to conduct the tail current. In other words, transistor M2 can only "pull" (discharge) the first stage output terminal voltage but cannot "push" (charge) the first stage output terminal voltage. To enable the differential pair of transistors M1 and M2 to both push and pull the single-ended first stage output terminal voltage, the first stage 105 includes a current mirror formed by a diode-connected PMOS transistor P2 having a gate coupled to a gate of a PMOS current mirror transistor P3. The sources of the diode-connected transistor P2 and the current mirror transistor P3 couple to a power supply node for the power supply voltage Vdd. The drain of the diode-connected transistor P2 couples to the drain of transistor M2. Similarly, the drain of the current mirror transistor P3 couples to the drain of transistor M1.

As the positive component Vin+rises and the negative component Vin-falls, the tail current will tend to conduct entirely through transistor M2 and through the diode-connected transistor P2. The conducting of the tail current through the diode-connected transistor P2 is then mirrored by the current mirror transistor P3 into a current that charges the first stage output terminal. In this fashion, the current mirror allows the differential pair of transistors to both discharge and charge the output terminal voltage of the first stage 155 as the differential input voltage changes or cycles. More generally, a differential-to-single-ended first stage of a two-stage circuit will include a diode-connected transistor such as the diode-connected transistor P2 in a current mirror configuration with a current mirror transistor such as the current mirror transistor P3.

The output terminal of the first stage 155 couples to a gate of the PMOS output transistor P1 in a second stage 160. The source of the output transistor P1 couples to the power supply rail or node for the power supply voltage whereas the drain of the output transistor P1 couples to ground through a load 140. In one implementation, load 140 may be formed by a parallel combination of a load resistor RL and a load capacitor CL but it will be appreciated that other suitable loads may be used. The drain of the output transistor P1 also couples to an output terminal for an output voltage Vo. As the first stage output terminal voltage falls, output transistor P1 will thus conduct and cause the output voltage Vo to rise. Conversely, a rise in the first stage output terminal voltage causes the output voltage Vo to fall. In this fashion, operational amplifier 150 may amplify the difference between the positive and negative components of the differential input voltage to produce the output voltage Vo.

To provide stability and compensation, the RC compensation circuit 125 couples between the gate and drain of the output transistor P1. The RC circuit 125 includes a capacitor C1 in series with a resistor R1. Power supply noise in the power supply voltage Vdd can conduct through the channel of the current mirror transistor P3 to the gate of the output transistor P1. Capacitor C1 is effectively an open circuit to the power supply noise at the lower power supply noise frequencies. Thus, at the lower power supply noise frequencies, the gate-to-source voltage of the output transistor P1 is not affected by the power supply noise. At relatively high-power supply noise frequencies, a non-dominant pole from the combination of the load capacitor CL and the load resistor RL in the frequency response of the operational amplifier 150 again shields the gate-to-source voltage of the output transistor P1 from responding to the power supply noise. But at mid-range power supply noise frequencies between these two extremes, the resulting power-supply-noise-induced conduction through the compensation RC circuit 125 can couple through to the output voltage.

To prevent this reduction in the power supply noise rejection at the mid-range power supply noise frequencies, the first stage 155 includes the RC circuit 115 that couples between the drain of the diode-connected transistor P2 and ground. RC circuit 115 includes a serial combination of a resistor R2 and a capacitor C2. Due to its diode-connection, the drain of the diode-connected transistor P2 is a relatively low impedance node 120 as compared to an impedance of the first stage output terminal. The loading of the relatively-low-impedance drain of the diode-connected transistor P2 with RC circuit 115 thus causes power supply noise at the mid-range frequencies to conduct a noise current through the channel of the diode-connected transistor P2 and through the RC circuit 115 to ground. The noise current is then mirrored by the current mirror transistor P3 to cause a power-supply-rejection current to conduct through the current mirror transistor P3 to the gate of the output transistor P1. This power-supply-rejection current is of opposite phase to the noise current that would otherwise flow through the RC compensation circuit 125 in the absence of the RC circuit 115. The loading of the drain of the diode-connected transistor P2 with RC circuit 115 thus functions as a power supply noise rejection filter in amplifier 150. For example, RC circuit 115 may provide greater than 20 dB of power supply rejection in the output voltage Vo at the mid-range power supply noise frequencies. In some implementations, the mid-range power supply noise frequency may be centered around 1 MHz, but it will be appreciated that such a mid-range center frequency may be higher or lower in frequency in alternative implementations. What is a mid-range power supply noise frequency depends upon the RC parameters of amplifier 150. In that regard, the resistance of resistor R2 in the RC circuit 115 is relatively unimportant so long as it is relatively low such as 100Ω. The selection of the capacitance of capacitor C2 in the RC circuit 115 has more of an effect on the power supply rejection and will be discussed further below.

Figure 2:
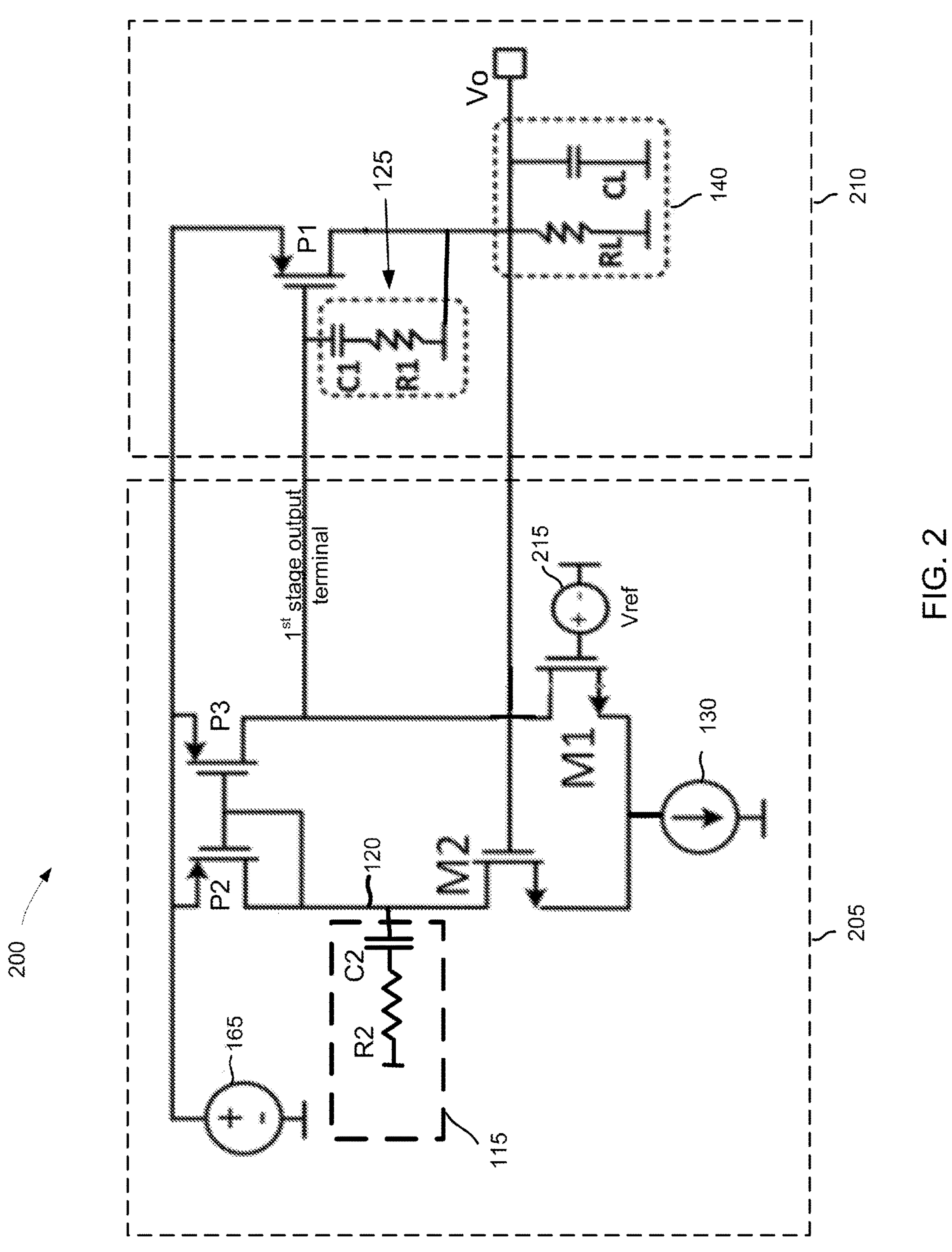
FIG. 2 is a circuit diagram of a two-stage low-dropout regulator with a power supply rejection filter formed by an RC circuit in accordance with an aspect of the disclosure.

The two-stage architecture such as discussed for amplifier 150 may be modified to form a low-dropout (LDO) regulator. An example LDO 200 is shown in FIG. 2. The differential pair of transistors M1 and M2 in an LDO first stage 205 are arranged with current source 130, diode-connected transistor P2, and current mirror transistor P3 as discussed with regard to OTA first stage 155. An LDO second stage 210 includes output transistor P1, RC compensation circuit 125, and output load 140 as discussed with regard to OTA second stage 160. In contrast to amplifier 150, the output voltage of the LDO second stage 205 drives the gate of transistor M2 in the LDO first stage 205. In addition, a reference voltage Vref from a reference voltage source 215 drives the gate of transistor M1 in the LDO first stage 205. The differential pair in LDO first stage 205 thus functions to regulate the output voltage to equal the reference voltage Vref. As discussed with regard to amplifier 150, the RC compensation circuit 125 at the gate of the output transistor P1 in the LDO second stage 210 conducts a power-supply noise current at mid-range power supply noise frequencies to undesirably affect the gate-to-source voltage of the output transistor P1 in the absence of RC circuit 115. At lower power supply noise frequencies, the capacitor C1 in the RC compensation circuit 125 is an open circuit to the power-supply noise current. Similarly, at higher ranges of the power supply noise frequencies, a pole from the RC output load 140 functions as a power supply rejection filter to reduce the effect of power supply noise for LDO 200. But at the mid-range power supply noise frequencies in the absence of the RC circuit 115, the power supply noise current conducts through the channel of the current mirror transistor P3 and through the compensation RC circuit 125. The inclusion of the RC circuit 115 is thus quite advantageous as it causes the current mirror transistor P3 to conduct a power-supply-rejection current as discussed with regard to amplifier 150 that is of opposite phase to the power-supply noise current that conducts through current mirror transistor P3 to the gate of output transistor P1. LDO 200 thus benefits from an advantageous power supply rejection at the mid-range frequencies of the power supply noise.

Figure 3:
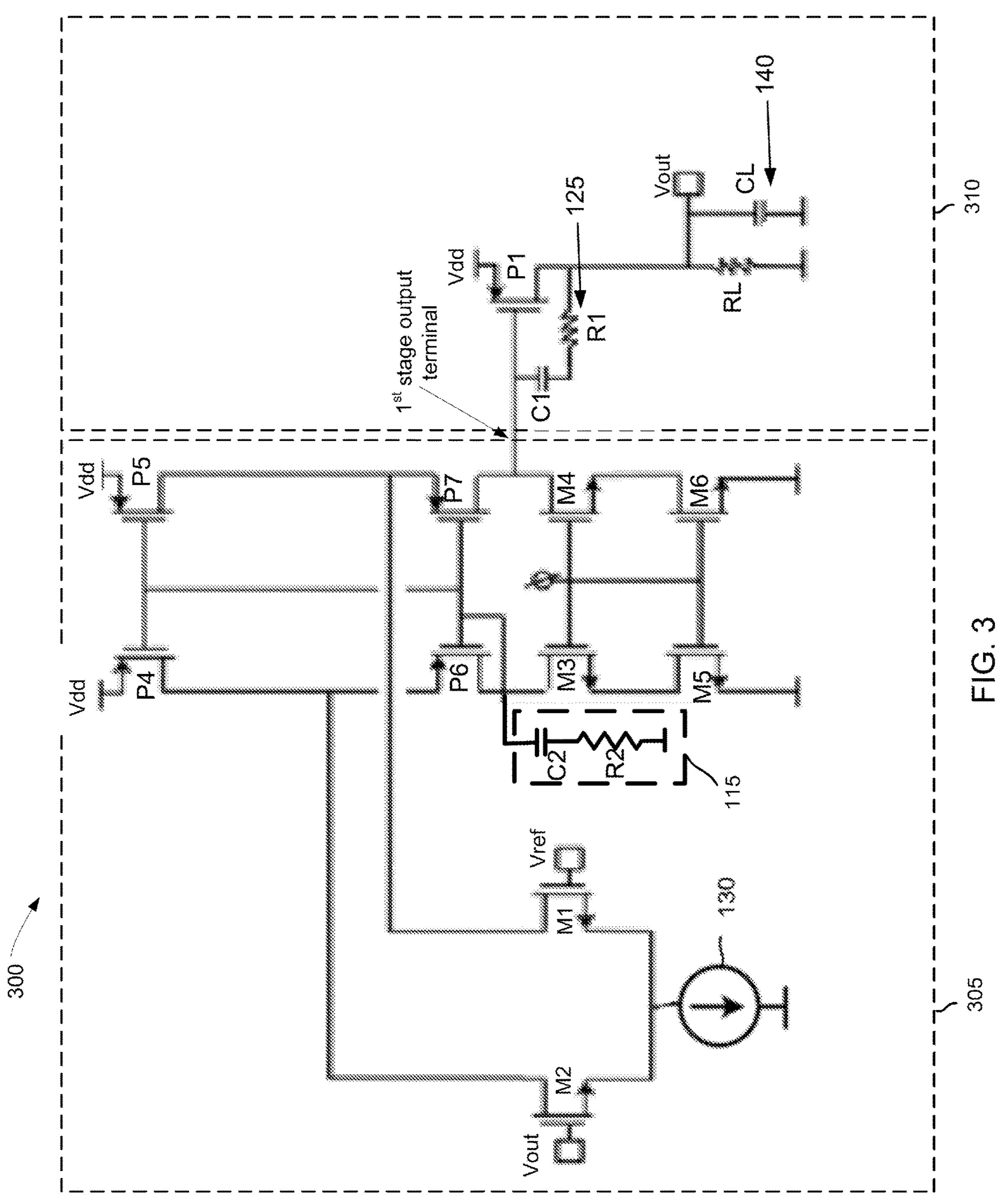
FIG. 3 is a circuit diagram of a two-stage folded cascode low-dropout regulator with a power supply rejection filter formed by an RC circuit in accordance with an aspect of the disclosure.

The first stage of LDO 200 may be modified to form a folded cascode first stage 305 as shown in FIG. 3 for a folded cascode LDO 300. A second stage 310 of folded cascode 300 is arranged as discussed with respect to second stages 150 and 210. The differential pair of transistors M1 and M2 in first stage 305 are biased by current source 130 as discussed for first stage 205. Similarly, the output voltage drives the gate of transistor M2 whereas the reference voltage drives the gate of transistor M1 in first stage 305 as discussed for first stage 205. The drains of transistors M1 and M2 couple to the power supply rail through respective PMOS cascode transistors. In particular, the drain of transistor M2 couples to a drain of a PMOS cascode transistor P4 having a source coupled to the power supply node. Similarly, the drain of transistor M1 couples to a drain of a PMOS cascode transistor P5 having a source coupled to the power supply node. The drain of cascode transistor P4 also couples to a source of a diode-connected PMOS transistor P6 having a gate coupled to a current mirror PMOS transistor P7. The gates of transistors P6 and P7 also couple to the gates of the cascode transistors P4 and P5. A drain of the current mirror transistor P7 forms the output node of first stage 305 that couples to the gate of the output transistor P1 in second stage 310.

The drain of current mirror transistor P7 also couples to a drain of an NMOS current source transistor M4 having a source coupled to a drain of a current source NMOS transistor M6 having a source coupled to ground. Similarly, the drain of the diode-connected transistor P6 couples through a series of a current source NMOS transistor M3 and a current source NMOS transistor M5 to ground. A bias voltage φ drives the gates of the current source transistors M3, M4, M5, and M6. The diode-connected transistor P6 and current mirror transistor P7 in first stage 305 form a current mirror so that the differential action of the output voltage and the reference voltage on the differential pair of transistors M2 and M1 can be converted into the single-ended output to second stage 310 analogously as discussed for first stages 150 and 205.

The cascode transistors P4 and PS do not isolate the diode-connected transistor P6 and the current mirror transistor P7 from power supply noise on the power supply node (the power supply node may also be denoted as a power supply rail). A noise current will thus conduct through the current mirror transistor P7 at the mid-range power supply noise frequencies and through the RC compensation circuit 125. To counteract this, the RC circuit 115 couples between the low-impedance drain of the diode-connected transistor P6 and ground. Thus, a power-supply-rejection current will conduct through current mirror transistor P7 that is of opposite phase to the noise current to substantially increase (e.g., by 20 dB) the power supply rejection of the folded cascode OTA at the mid-range power supply noise frequencies.

Figure 4:
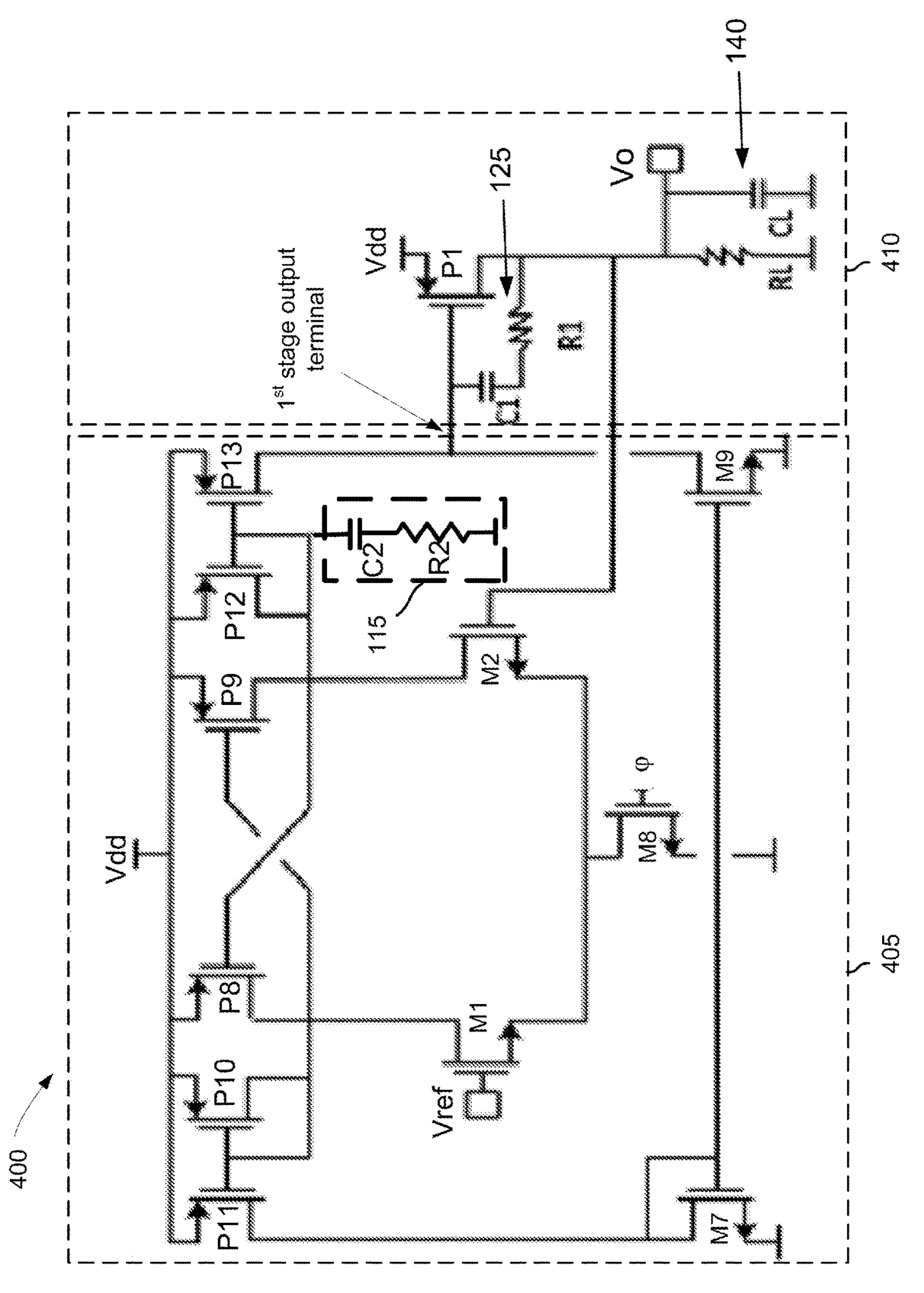
FIG. 4 is a circuit diagram of a symmetrical operational transconductance amplifier low-dropout regulator with a power supply rejection filter formed by an RC circuit in accordance with an aspect of the disclosure.

In another implementation, the first stage 205 of LDO 200 may be modified into a symmetrical OTA first stage 405 as shown in FIG. 4 for a symmetrical OTA LDO 400. A second stage 410 of OTA 400 is arranged as discussed for second stages 210 and 310. The output voltage drives a gate of transistor M2 in the differential pair of transistors whereas the reference voltage Vref drives the gate of transistor M1 in the differential pair of transistors as discussed with regard to first stages 205 and 305. The sources of transistors M1 and M2 couple to ground through a current source formed by an NMOS current source transistor M8 having its gate biased by a bias voltage q. To enhance the gain, the drains of the differential pair of transistors M1 and M2 couple to the power supply node through a cross-coupled pair of PMOS transistors P8 and P9. In particular, the drain of transistor M1 couples to the drain of transistor P8 and to the gate of transistor P9. Similarly, the drain of transistor M2 couples to the drain of transistor P9 and to the gate of transistor P8. The sources of transistors P8 and P9 couple to the power supply rail.

To provide a single-ended output from the differential pair of transistors M1 and M2 as boosted by the cross-coupled pair of transistors P8 and P9, the drain of transistor P9 couples to the drain of a diode-connected PMOS transistor P12 having a source coupled to the power supply rail. The gate (and drain) of the diode-connected transistor P12 couples to the gate of a current mirror PMOS transistor P13. As transistor M2 conducts more than transistor M1, a corresponding current is mirrored through a first current mirror formed by the diode-connected transistor P12 and the current mirror transistor P13 to drive a first stage output terminal at the drain of the current mirror transistor P13.

To also allow transistor M1 to affect the output terminal voltage of first stage 405, the drain of transistor P8 couples to a second current mirror formed by a diode-connected PMOS transistor P10 and a current mirror PMOS transistor P11 that are arranged symmetrically with respect to transistors P12 and P13, respectively. As transistor M1 conducts, a corresponding current is thus mirrored to conduct through current mirror transistor P11. A third current mirror formed by a diode-connected transistor NMOS M7 and a current mirror NMOS transistor M9 then mirrors this current to the output terminal of first stage 405. In particular, the drain of current mirror transistor P11 couples to a drain (and gate) of the diode-connected transistor M7 having a gate coupled to a gate of the current mirror transistor M9. The sources of the diode-connected transistor M7 and the current mirror transistor M9 couple to ground. Diode-connected transistor M7 and the current mirror transistor M9 thus form a third current mirror that mirrors the current conducted by the current mirror transistor P11. A drain of the current mirror transistor M9 couples to the first stage output terminal. It may thus be seen that the differential action of the differential pair of transistors M1 and M2 as boosted by the cross-coupled pair of transistors P8 and P9 is translated to a single-ended charging and discharging of the first stage output terminal voltage. In particular, as transistor M1 conducts more than transistor M2, the first stage output terminal voltage is decreased whereas the first stage output terminal voltage is increased as transistor M2 conducts more than transistor M1.

With regard to this differential-to-single-ended action of the first stage 405, the drain of the diode-connected transistor P12 is a convenient low-impedance location for the RC circuit 115 to couple between the drain of the diode-connected transistor P12 and ground. As power supply noise conducts through diode-connected transistor P12 and RC circuit 115 into ground, a power-supply-rejection current is mirrored through the current mirror transistor P13. This power-supply-rejection current is of oppositive phase to a noise current that is also excited by the power supply noise to conduct through current mirror transistor P13 and the RC compensation circuit 125. In this fashion, the power supply noise at the mid-range frequencies of the power supply noise is substantially filtered from affecting the gate-to-source voltage of the output transistor P1 in symmetrical OTA LDO 400.

Figure 5:
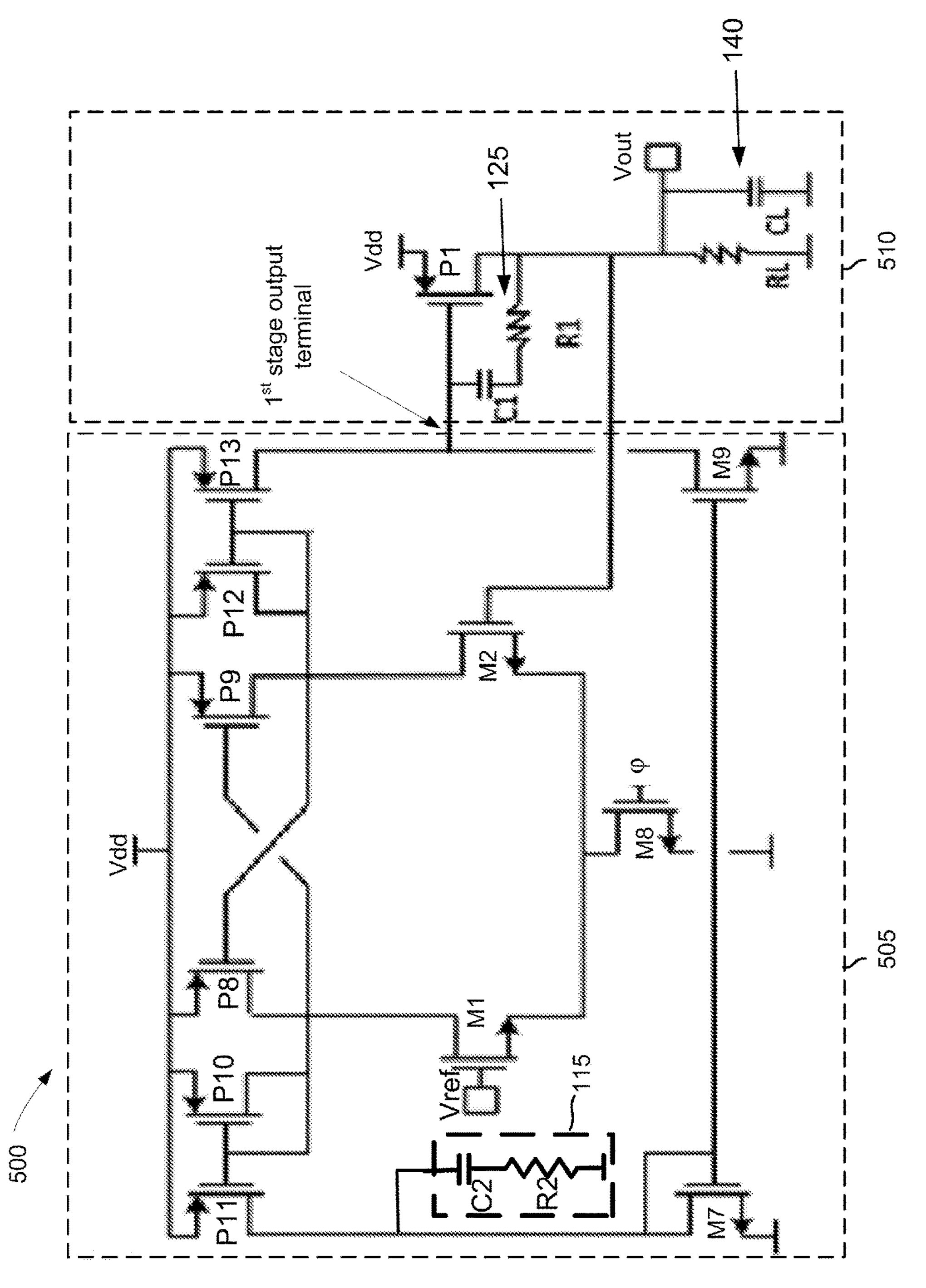
FIG. 5 is a circuit diagram of a symmetrical operational transconductance amplifier low-dropout regulator with a power supply rejection filter formed by an RC circuit in accordance with an aspect of the disclosure.

Since first stage 405 has the second current mirror formed by the diode-connected transistor M7 and the current mirror transistor M9, the drain of the diode-connected transistor M7 is also another low-impedance node that can be loaded by the RC circuit 115 and induce a power-supply-rejection current into the first stage output terminal that is of opposite phase to the noise current that would otherwise be conducted by the RC compensation circuit 125. Referring now to FIG. 5, a symmetrical OTA LDO 500 is shown that includes a first stage 505 that is arranged as discussed for first stage 405 except that the RC circuit 115 now couples to ground from the drain of the diode-connected transistor M7 instead of the drain of the diode-connected transistor P12. A second stage 510 is arranged as discussed with regard to second stage 210. Suppose that power supply noise at the mid-range power supply noise frequencies causes the power supply voltage to suddenly increase and induce a noise current through the RC compensation circuit 125. Without any power supply rejection, the gate-to-source voltage of the output transistor P1 then becomes uncoupled from the changing power supply voltage such that the gate-to-source voltage of the output transistor P1 undesirably increases. But this same sudden increase in the power supply voltage induces a noise current through RC circuit 115, which in turn reduces a current conducted by diode-connected transistor M7. This causes a reduced current to be conducted by the current mirror transistor M9. In this fashion, the gate voltage of the output transistor P1 may rise with the rise in the power supply voltage to keep the gate-to-source voltage of the output transistor P1 relatively constant despite the power supply noise disturbance.

With regard to the selection of the capacitance of the capacitor C2 in the RC circuit 115, it can be shown that RC circuit 115 in the two-stage circuits discussed herein introduces a pair of complex zeroes in their power supply rejection transfer functions. The frequency of the pair of complex zeroes determines a notch frequency in the power supply rejection transfer functions. It is thus desirable to increase the frequency of the pair of complex zeroes and reduce the resulting damping. A suitable design protocol may thus consist of first optimizing the performance of the two-stage circuit without the inclusion of the RC circuit 115. To optimize the RC circuit 115, a suitable low value of the resistance of resistor R2 may first be selected (e.g., 100Ω in some implementations). Then the capacitance of capacitor C2 is adjusted to minimize the damping in the two-stage circuit's transfer function and deepen the notch in the transfer function at the complex zero frequency.

Figure 6:
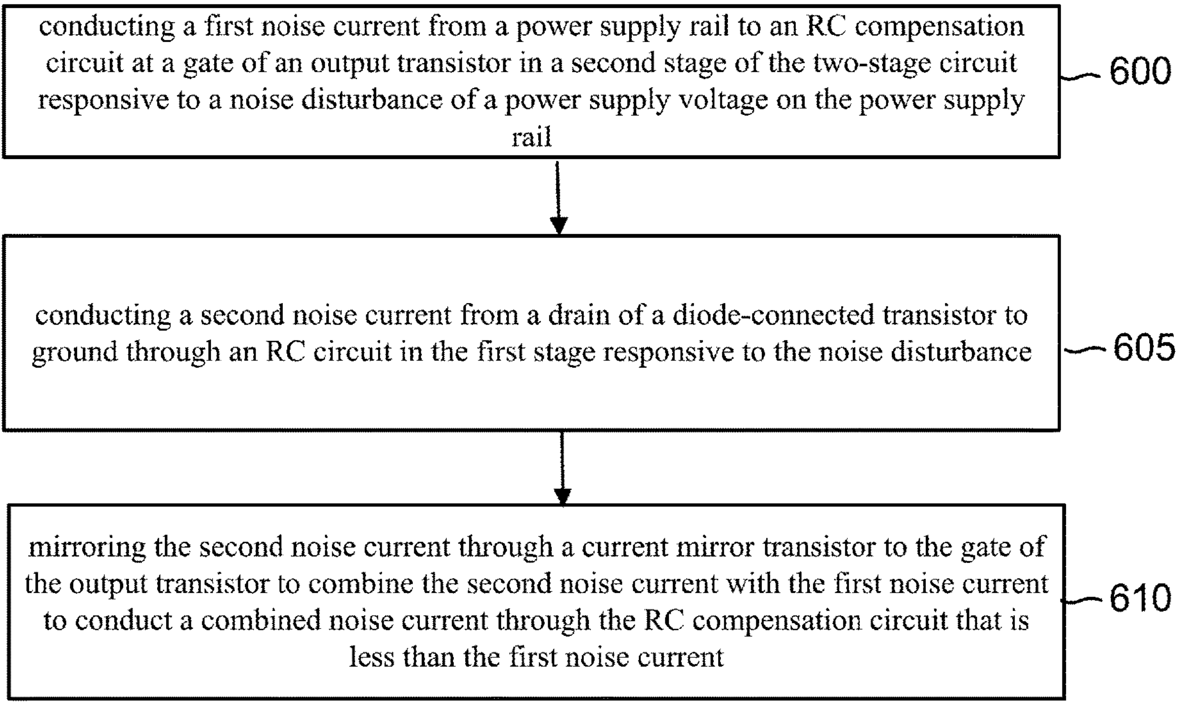
FIG. 6 is a flowchart for a power supply rejection method for a two-stage circuit in accordance with an aspect of the disclosure.

A method of power supply noise rejection for a two-stage circuit will now be discussed with regard to the flowchart of FIG. 6. The method includes an act 600 of conducting a first noise current from a power supply rail to an RC compensation circuit at a gate of an output transistor in a second stage of the two-stage circuit responsive to a noise disturbance of a power supply voltage on the power supply rail. The noise-induced current that would otherwise flow in RC compensation circuit 125 in the absence of the RC circuit 115 of operational amplifier 150, LDO 200, folded cascode 300, symmetrical OTA LDO 400, or symmetrical OTA LDO 500 is an example of act 600. The method also includes an act 605 of conducting a second noise current from a drain of a diode-connected transistor to ground through an RC circuit in the first stage responsive to the noise disturbance. The noise-induced current conduction through the RC circuit 115 of operational amplifier 150, LDO 200, folded cascode 300, symmetrical OTA LDO 400, or symmetrical OTA LDO 500 is an example of act 605. Finally, the method includes an act 610 of mirroring the second noise current through a current mirror transistor to the gate of the output transistor to combine the second noise current with the first noise current to conduct a combined noise current through the RC compensation circuit that is less than the first noise current. The mirroring through current mirror transistor P3 of operational amplifier 150 and LDO 200, current mirror transistor P7 of folded cascode LDO 300, current mirror transistor P13 of symmetrical OTA LDO 400, and current mirror transistor M9 of symmetrical OTA LDO 500 are examples of act 610.

Figure 7:
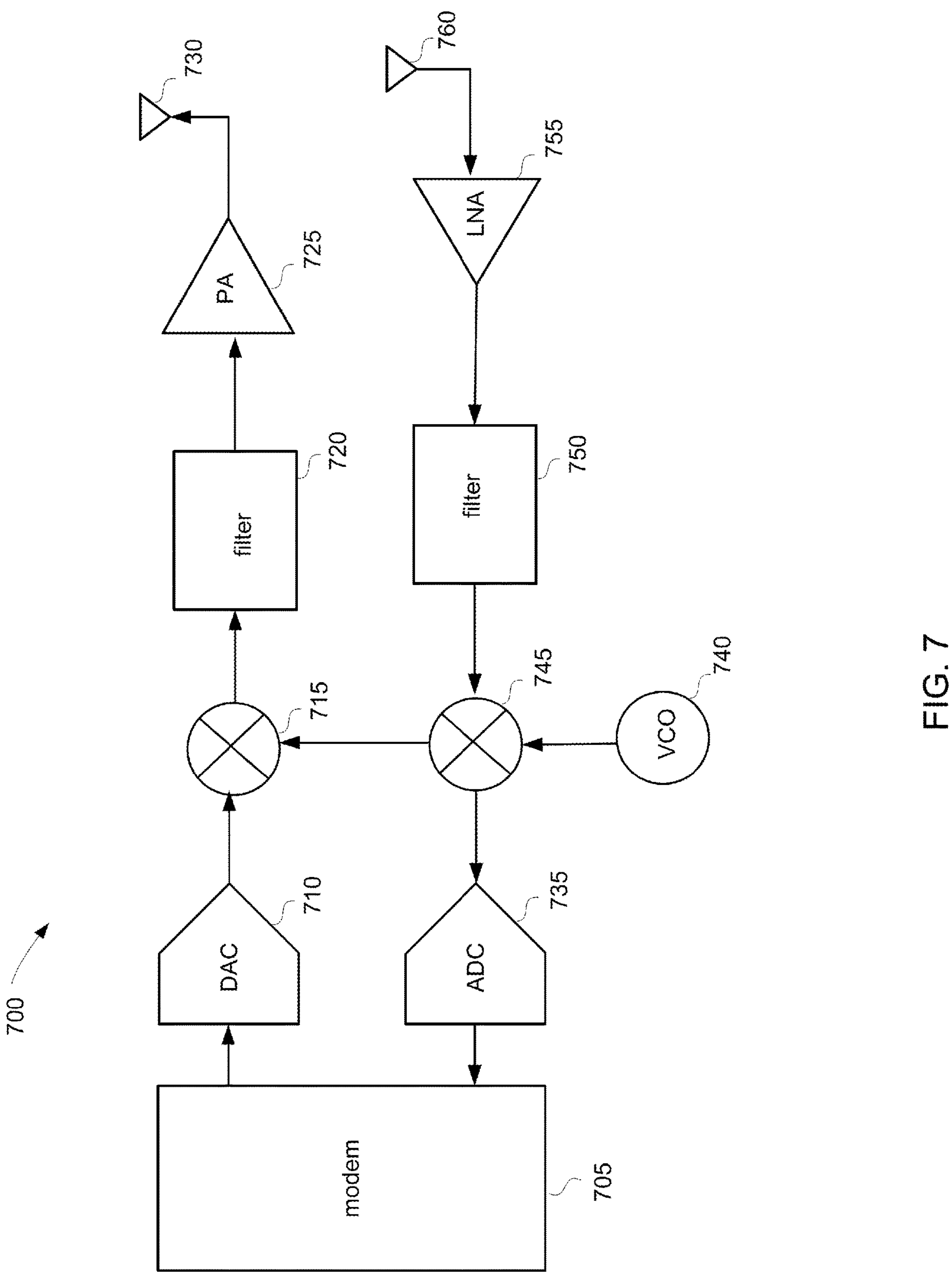
FIG. 7 illustrates an example transceiver including a two-stage architecture having a power supply rejection filter in accordance with an aspect of the disclosure.

A two-stage OTA or LDO with the power supply rejection disclosed herein may be advantageously employed in a wide variety of electronic systems. For example, a transceiver 700 as shown in FIG. 7 benefits from the implementation of the power supply rejection. A modem 700 generates a digital signal for transmission through a transmit RF chain. The transmit RF chain includes a DAC 710 that converts the digital signal from modem 700 into a baseband analog signal. A mixer 715 mixes the baseband analog signal with a local oscillator signal from a source such as a voltage-controlled oscillator (VCO) 740 to produce an RF signal that is filtered by a filter 720. A power amplifier (PA) 725 amplifies the filtered output from filter 720 to drive a transmit antenna 730. It will be appreciated that the resulting transmit RF chain just described may have many variations but that an LDO with the power supply rejection described herein may be used to regulate the power supply voltage of the components in the transmit RF chain.

A receive RF chain for transceiver 700 begins at a receive antenna 760, which feeds a low-noise amplifier (LNA) 755. A filter 750 filters an amplified output signal of the LNA 755 to drive a mixer 745. The mixer 745 down converts the filtered output signal from filter 750 to form a baseband analog signal that is converted into digital form by an ADC 735 so that the modem 705 may receive a digitized received signal. Analogous to the transmit RF chain, it will be appreciated that the receive RF chain may have many variations but that an LDO with the power supply rejection described herein may regulate the power supply voltage of the components in the receive RF chain. In addition, an OTA with the power supply rejection as described herein may be used within transceiver 700. Other systems in addition to transceiver 700 may benefit from the power supply rejection described herein.

Figure 8:
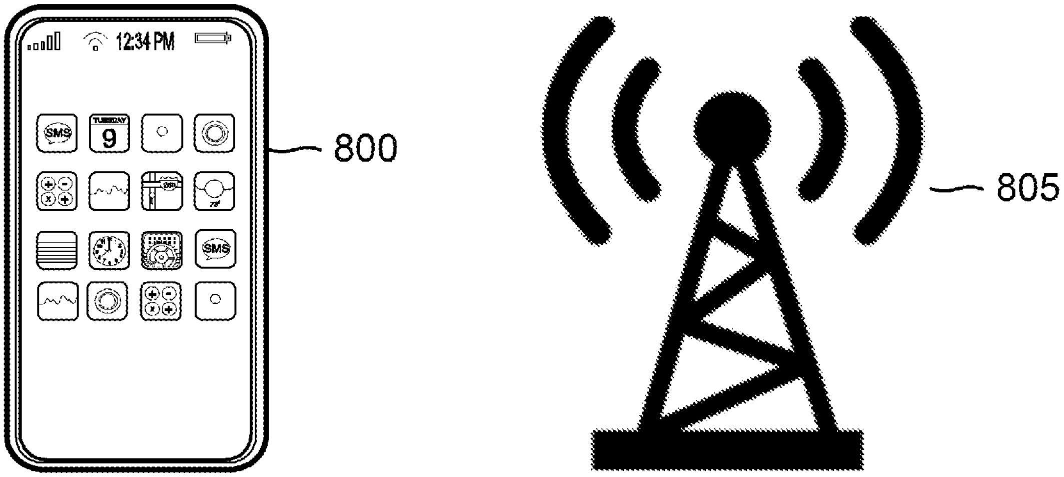
FIG. 8 illustrates some example electronic systems including a two-stage circuit with a power supply rejection filter formed by an RC circuit in accordance with an aspect of the disclosure.

Some example systems including a two-stage OTA or LDO with power supply rejection as described herein include a cellphone 800 or a base station 805 as shown in FIG. 8.

The disclosure will now be summarized in the following series of clauses:

Clause 1. A two-stage circuit comprising:
- a first stage including:
  - a differential pair of transistors;
  - a current mirror coupled to a terminal of a first transistor in the differential pair of transistors, the current mirror including a diode-connected transistor;
  - a resistor-capacitor (RC) circuit that is coupled between a drain of the diode-connected transistor and ground; and
- a second stage including an output transistor having a gate coupled to an output terminal of the first stage.

Clause 2. The two-stage circuit of clause 1, wherein the second stage further includes:
- an RC compensation circuit coupled between the gate and a drain of the output transistor; and
- an RC load coupled between the drain of the output transistor and ground.

Clause 3. The two-stage circuit of any of clauses 1-2, further comprising:
- a current source coupled to a source of the first transistor in the differential pair of transistors and to a source of a second transistor in the differential pair of transistors.

Clause 4. The two-stage circuit of any of clauses 1-3, wherein the diode-connected transistor has a source coupled to a power supply node for a power supply voltage and has a drain coupled to a drain of the first transistor in the differential pair of transistors.

Clause 5. The two-stage circuit of clause 4, wherein a current source transistor in the current mirror has a source coupled to a power supply node and has a drain coupled to a drain of a second transistor in the differential pair of transistors.

Clause 6. The two-stage circuit of any of clauses 1-5, wherein the differential pair of transistors comprises a pair of n-type metal-oxide semiconductor (NMOS) transistors and wherein the diode-connected transistor and the output transistor each comprises a p-type metal-oxide semiconductor (PMOS) transistor.

Clause 7. The two-stage circuit of any of clauses 1-6, wherein the output transistor has a source coupled to a power supply node and a drain configured to form an output terminal of the two-stage circuit.

Clause 8. The two-stage circuit of any of clauses 1-6, wherein the two-stage circuit comprises a two-stage amplifier, and wherein a gate of the first transistor is coupled to a node for a first component of a differential input voltage and wherein a gate of a second transistor in the differential pair of transistors has a gate coupled to a node for a second component of the differential input voltage.

Clause 9. The two-stage circuit of any of clauses 1-6, wherein the two-stage circuit comprises a two-stage low dropout regulator, and wherein a gate of the first transistor is coupled to a drain of the output transistor, the low dropout regulator further comprising:

a reference voltage source configured to bias a gate of a second transistor in the differential pair of transistors with a reference voltage.

Clause 10. The two-stage circuit of clause 9, further comprising:

a first cascode transistor coupled to the terminal of the first transistor; and a second cascode transistor coupled to a terminal of the second transistor.

Clause 11. The two-stage circuit of clause 9, the two-stage circuit further comprising:

a first cross-coupled transistor having a drain coupled to a drain of the first transistor and having a gate coupled to a drain of the second transistor;

a second cross-coupled transistor having a drain coupled to a drain of the second transistor and having a gate coupled to the drain of the first transistor.

Clause 12. The two-stage circuit of clause 11, wherein the diode-connected transistor has its drain coupled to the drain of the first transistor.

Clause 13. The two-stage circuit of any of clauses 1-12, wherein the resistor-capacitor circuit comprises a resistor in series with a capacitor.

Clause 14. The two-stage circuit of clause 2, wherein RC compensation circuit comprises a resistor in series with a capacitor.

Clause 15. A power supply rejection method for a two-stage circuit, comprising conducting a first noise current from a power supply rail to an RC compensation circuit at a gate of an output transistor in a second stage of the two-stage circuit responsive to a noise disturbance of a power supply voltage on the power supply rail;

conducting a second noise current from a drain of a diode-connected transistor in a current mirror to ground through an RC circuit in a first stage of the two-stage circuit responsive to the noise disturbance; and mirroring the second noise current through the current mirror to the gate of the output transistor to combine the second noise current with the first noise current to conduct a combined noise current through the RC compensation circuit that is less than the first noise current.

Clause 16. The method of clause 15, further comprising:

driving a differential pair of transistors in the first stage with a differential input voltage to drive a gate voltage of the output transistor.

Clause 17. The method of clause 15, further comprising:

driving a first transistor in a differential pair of transistors in the first stage with an output voltage from the second stage while driving a second transistor in the differential pair of transistors with a reference voltage.

Clause 18. The method of any of clauses 15-17, further comprising:

biasing the differential pair of transistors with a current from a current source.

Clause 19. A two-stage circuit, comprising:

a first stage including:

a first stage output terminal;

a low-impedance node, wherein an impedance of the low-impedance node is lower than an impedance of the first stage output terminal;

a differential pair of transistors coupled to the first stage output terminal and the low-impedance node;

an RC circuit having a resistor in series with a capacitor, wherein the RC circuit is coupled between ground and the low-impedance node; and a second stage including an output transistor having a gate coupled to the first stage output terminal.

Clause 20. The two-stage circuit of clause 19, further comprising:

an RC compensation circuit coupled between the gate and a drain of the output transistor; and an RC load coupled between the drain of the output transistor and ground.

Clause 21. The two-stage circuit of any of clauses 19-20, further comprising:

a current source coupled between ground and a source of a first transistor in the differential pair of transistors and a source of a second transistor in the differential pair of transistors.

Clause 22. The two-stage circuit of any of clauses 19-21, wherein a drain of the output transistor is coupled to a gate of a first transistor in the differential pair of transistors, the two-stage circuit further comprising a reference voltage source configured to bias a gate of a second transistor in the differential pair of transistors with a reference bias voltage.

Clause 23. The two-stage circuit of clause 22, wherein the two-stage circuit is incorporated into a voltage-controlled oscillator in a cellular telephone.

Clause 24. The two-stage circuit of any of clauses 22-23, further comprising: a diode-connected transistor coupled to a drain of the first transistor in differential pair of transistors.

Clause 25. The two-stage circuit of clause 24, further comprising:

a current mirror transistor having a gate coupled to a gate of the diode-connected transistor and having drain coupled to the first stage output terminal.

Clause 26. The two-stage circuit of clause 25, wherein a source of the diode-connected transistor, a source of the current mirror transistor, and a source of the output transistor are all coupled to a node for a power supply voltage.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

We claim:

1. A two-stage circuit comprising:

a first stage including:

a differential pair of transistors;

a current mirror coupled to a terminal of a first transistor in the differential pair of transistors, the current mirror including a diode-connected transistor;

a resistor-capacitor (RC) circuit that is coupled between a drain of the diode-connected transistor and ground; and a second stage including an output transistor having a gate coupled to an output terminal of the first stage, wherein the two-stage circuit comprises a two-stage low dropout regulator, and wherein a gate of the first transistor in the differential pair of transistors is coupled to a drain of the output transistor, the two-stage low dropout regulator further comprising:

a reference voltage source configured to bias a gate of a second transistor in the differential pair of transistors with a reference voltage.

2. The two-stage circuit of claim 1, wherein the second stage further includes:

an RC compensation circuit coupled between the gate and a drain of the output transistor; and an RC load coupled between the drain of the output transistor and ground.

3. The two-stage circuit of claim 1, further comprising:

a current source coupled to a source of the first transistor in the differential pair of transistors and to a source of the second transistor in the differential pair of transistors.

4. The two-stage circuit of claim 1, wherein the diode-connected transistor has a source coupled to a power supply node for a power supply voltage and has a drain coupled to a drain of the first transistor in the differential pair of transistors.

5. The two-stage circuit of claim 1, wherein a current mirror transistor in the current mirror has a source coupled to a power supply node and has a drain coupled to a drain of the second transistor in the differential pair of transistors.

6. The two-stage circuit of claim 1, wherein the differential pair of transistors comprises a pair of n-type metal-oxide semiconductor (NMOS) transistors and wherein the diode-connected transistor and the output transistor each comprises a p-type metal-oxide semiconductor (PMOS) transistor.

7. The two-stage circuit of claim 1, wherein the output transistor has a source coupled to a power supply node and a drain configured to form an output terminal of the two-stage circuit.

8. The two-stage circuit of claim 1, wherein the diode-connected transistor has its drain coupled to a drain of the first transistor of the differential pair of transistors.

9. The two-stage circuit of claim 1, wherein the resistor-capacitor circuit comprises a resistor in series with a capacitor.

10. The two-stage circuit of claim 2, wherein RC compensation circuit comprises a resistor in series with a capacitor.

11. A two-stage circuit, comprising:

a first stage including:

a first stage output terminal;

a low-impedance node, wherein an impedance of the low-impedance node is lower than an impedance of the first stage output terminal;

a differential pair of transistors coupled to the first stage output terminal and the low-impedance node;

an RC circuit having a resistor in series with a capacitor, wherein the RC circuit is coupled between ground and the low-impedance node; and a second stage including an output transistor having a gate coupled to the first stage output terminal, wherein a drain of the output transistor is coupled to a gate of a first transistor in the differential pair of transistors, the two-stage circuit further comprising a reference voltage source configured to bias a gate of a second transistor in the differential pair of transistors with a reference bias voltage.

12. The two-stage circuit of claim 11, further comprising:

an RC compensation circuit coupled between the gate and a drain of the output transistor; and an RC load coupled between the drain of the output transistor and ground.

13. The two-stage circuit of claim 11, further comprising:

a current source coupled between ground and a source of the first transistor in the differential pair of transistors and a source of the second transistor in the differential pair of transistors.

14. The two-stage circuit of claim 11, wherein the two-stage circuit is incorporated into a voltage-controlled oscillator in a cellular telephone.

15. The two-stage circuit of claim 11, further comprising:

a diode-connected transistor coupled to a drain of the first transistor in the differential pair of transistors.

16. The two-stage circuit of claim 15, further comprising:

a current mirror transistor having a gate coupled to a gate of the diode-connected transistor and having drain coupled to the first stage output terminal.

17. The two-stage circuit of claim 16, wherein a source of the diode-connected transistor, a source of the current mirror transistor, and a source of the output transistor are all coupled to a node for a power supply voltage.

* * * * *